(12) United States Patent  
Shor et al.

(10) Patent No.: US 7,256,438 B2
(45) Date of Patent: Aug. 14, 2007

(54) MOS CAPACITOR WITH REDUCED PARASITIC CAPACITANCE

(75) Inventors: Joseph S. Shor, Tel Mond (IL); Eduardo Maayan, Kfar Saba (IL); Yoram Betser, Mazkeret Batya (IL)

(73) Assignee: Saifun Semiconductors Ltd, Netanya (IL)

(*) Notice: Subject to any disclaimer, the term of this patent is extended or adjusted under 35 U.S.C. 154(b) by 0 days.

(21) Appl. No.: 10/862,405

(22) Filed: Jun. 8, 2004

(65) Prior Publication Data

US 2005/0269619 A1   Dec. 8, 2005

(51) Int. Cl.
*H01L 27/108* (2006.01)
*H01L 29/76* (2006.01)
*H01L 29/94* (2006.01)
*H01L 31/119* (2006.01)

(52) U.S. Cl. ............ 257/299; 257/313; 257/532
(58) Field of Classification Search .......... 257/296, 257/299, 313, 532, 535
See application file for complete search history.

(56) References Cited

U.S. PATENT DOCUMENTS

| 4,961,010 | A | 10/1990 | Davis |
| 5,029,063 | A | 7/1991 | Lingstaedt et al. |
| 5,081,371 | A | 1/1992 | Wong |
| 5,142,495 | A | 8/1992 | Canepa |
| 5,142,496 | A | 8/1992 | Van Buskirk |
| 5,276,646 | A | 1/1994 | Kim et al. |
| 5,280,420 | A | 1/1994 | Rapp |
| 5,381,374 | A | 1/1995 | Shiraishi et al. |
| 5,534,804 | A | 7/1996 | Woo |
| 5,553,030 | A | 9/1996 | Tedrow et al. |
| 5,559,687 | A | 9/1996 | Nicollini et al. |
| 5,581,252 | A | 12/1996 | Thomas |
| 5,612,642 | A | 3/1997 | McClintock |
| 5,636,288 | A | 6/1997 | Bonneville et al. |
| 5,663,907 | A | 9/1997 | Frayer et al. |
| 5,672,959 | A | 9/1997 | Der |
| 5,675,280 | A | 10/1997 | Nomura et al. |
| 5,708,608 | A | 1/1998 | Park et al. |

(Continued)

FOREIGN PATENT DOCUMENTS

EP   0693781   1/1996

(Continued)

OTHER PUBLICATIONS

Martin, "Improved Circuits for the Realization of Switched-Capacitor Filters", IEEE Transactions on Circuits and Systems, Apr. 1980, pp. 237-244, vol. CAS-27.

(Continued)

*Primary Examiner*—Thien F Tran
(74) *Attorney, Agent, or Firm*—Eitan Law Group

(57) ABSTRACT

A capacitor including a first active layer capacitively coupled to a second active layer, the second active layer being capacitively coupled to a third layer, the third layer being capacitively coupled to a fourth layer, wherein an anode of the capacitor is connected to one of the first and second active layers, and a cathode of the capacitor is connected to the other one of the first and second active layers, and wherein the third layer is left floating. The fourth layer may be connected to a supply voltage, such as but not limited to, ground.

3 Claims, 5 Drawing Sheets

U.S. PATENT DOCUMENTS

| | | | |
|---|---|---|---|
| 5,717,581 | A | 2/1998 | Canclini |
| 5,726,946 | A | 3/1998 | Yamagata et al. |
| 5,760,634 | A | 6/1998 | Fu |
| 5,808,506 | A | 9/1998 | Tran |
| 5,815,435 | A | 9/1998 | Van Tran |
| 5,847,441 | A | 12/1998 | Cutter et al. |
| 5,880,620 | A | 3/1999 | Gitlin et al. |
| 5,903,031 | A | 5/1999 | Yamada et al. |
| 5,910,924 | A | 6/1999 | Tanaka et al. |
| 5,946,258 | A | 8/1999 | Evertt et al. |
| 5,963,412 | A | 10/1999 | En |
| 6,005,423 | A | 12/1999 | Schultz |
| 6,028,324 | A | 2/2000 | Su et al. |
| 6,040,610 | A | 3/2000 | Noguchi et al. |
| 6,064,251 | A | 5/2000 | Park |
| 6,075,402 | A | 6/2000 | Ghilardelli et al. |
| 6,081,456 | A | 6/2000 | Dadashev |
| 6,094,095 | A | 7/2000 | Murray et al. |
| 6,107,862 | A | 8/2000 | Mukainakano et al. |
| 6,118,207 | A | 9/2000 | Ormerod et al. |
| 6,130,572 | A | 10/2000 | Ghilardelli et al. |
| 6,130,574 | A | 10/2000 | Bloch et al. |
| 6,150,800 | A | 11/2000 | Kinoshita et al. |
| 6,154,081 | A | 11/2000 | Pakkala et al. |
| 6,157,242 | A | 12/2000 | Fukul |
| 6,188,211 | B1 | 2/2001 | Rincon-Mora et al. |
| 6,198,342 | B1 | 3/2001 | Kawai |
| 6,208,200 | B1 | 3/2001 | Arakawa |
| 6,246,555 | B1 | 6/2001 | Tham |
| 6,285,614 | B1 | 9/2001 | Mulatti et al. |
| 6,297,974 | B1 | 10/2001 | Ganesan et al. |
| 6,339,556 | B1 | 1/2002 | Watanabe |
| 6,353,356 | B1 | 3/2002 | Liu |
| 6,356,469 | B1 | 3/2002 | Roohparvar et al. |
| 6,359,501 | B2 | 3/2002 | Lin et al. |
| 6,400,209 | B1 | 6/2002 | Matsuyama et al. |
| 6,433,624 | B1 | 8/2002 | Grossnickle et al. |
| 6,452,438 | B1 | 9/2002 | Li |
| 6,515,903 | B1 * | 2/2003 | Le et al. ......... 365/185.18 |
| 6,577,514 | B2 | 6/2003 | Shor et al. |
| 6,608,526 | B1 | 8/2003 | Sauer |
| 6,614,295 | B2 | 9/2003 | Tsuchi |
| 6,627,555 | B2 | 9/2003 | Eitan et al. |
| 6,654,296 | B2 | 11/2003 | Jang et al. |
| 6,665,769 | B2 | 12/2003 | Cohen et al. |
| 6,677,805 | B2 | 1/2004 | Shor et al. |
| 2002/0140109 | A1 * | 10/2002 | Keshavarzi et al. ........ 257/782 |
| 2002/0145465 | A1 | 10/2002 | Shor et al. |
| 2003/0076159 | A1 | 4/2003 | Shor et al. |
| 2003/0202411 | A1 | 10/2003 | Yamada |
| 2004/0151034 | A1 | 8/2004 | Shor et al. |

FOREIGN PATENT DOCUMENTS

| | | |
|---|---|---|
| EP | 0 843 398 | 5/1998 |
| JP | 02001118392 | 4/2001 |

OTHER PUBLICATIONS

Klinke. et al., "A Very-High-Stew-Rate CMOS Operational Amplifier", IEEE Journal of Solid-State Circuits, 1989. pp. 744-746, vol. 24.

Shor, et al. "paper WA2.04 01—Self regulated Four-Phased Charge Pump with Boosted Wells". ISCAS 2002, 2002.

Fotouhi, "An Efficient CMOS Line Driver for 1.544-Mb/s T1 and 2 048-Mb/s E1 Applications", IEEE Journal of Solid-State Circuits, 2003, pp. 226-236, vol. 38.

* cited by examiner

MOS CAPACITOR WITH REDUCED PARASITIC CAPACITANCE

FIELD OF THE INVENTION

The present invention relates generally to MOS (metal oxide semiconductor) capacitors used in analog circuits, such as charge pumps, voltage regulators, amplifiers etc., and particularly to a method and apparatus to reduce parasitic capacitances in such capacitors.

BACKGROUND OF THE INVENTION

In standard, single poly CMOS (complementary metal oxide semiconductor) processes, gate capacitors are capacitive elements with large capacitances. These capacitors possess the desired gate capacitance, but also have parasitic capacitances, which are associated with diode elements, such as wells and diffusions.

An example of a MOS capacitor 10 is shown in FIG. 1. The MOS capacitor 10 includes a conductive layer 11 disposed on a gate oxide 12 disposed over a semiconductor substrate having two n+ diffusions 14 contacting an N-well 16 that overlies a P-substrate 18. The anode of MOS capacitor 10 is the gate terminal, i.e., the terminal connected to the conductive layer overlaid on the gate oxide 12. The two n+ diffusions 14 form the cathode (source-drain).

When a positive voltage is applied to the anode, an accumulation layer forms at the gate oxide—semiconductor junction, and the capacitance is the gate capacitance. It is also possible to achieve the same capacitance by making the two diffusions p+, and having a separate n+ contact to the well (not shown), making it an accumulation capacitor. Both types of capacitors exhibit essentially the same capacitance once the Vg (gate potential, or anode/cathode potential) is above the threshold voltage for the capacitor. The MOS capacitor 10 also exhibits a parasitic capacitance at its cathode, which is caused by a parasitic diode capacitor 20 formed between the N-well 16 and substrate 18. The parasitic diode capacitor 20 is determined by the area and space-charge layer thickness of the diode, and may be 20% of the gate capacitance.

Such MOS capacitors are utilized in a variety of analog circuits, such as charge pumps. A four phase Dickson-type charge pump is shown in FIG. 2, while a single pump stage is shown in FIG. 3. U.S. patent application 2002/0145464, entitled "Charge Pump Stage with Body Effect Minimization", which is incorporated herein in its entirety by reference, provides an explanation how the charge pump and the single stage operates. A brief explanation is now provided in the following paragraphs, with reference to FIGS. 2 and 3.

A charge pump typically comprises cascaded stages that progressively boost the voltage to higher levels. The charge pump functions by progressively storing more charge on a capacitor which is part of a capacitor-diode combination, with several such stages being placed together in a network to obtain the desired increase in voltage. The diode functions to prevent discharge of the capacitor prior to placing the additional charge thereon.

The charge pump circuit of FIG. 2 includes a plurality of charge transfer transistors (reference letters m(i)) connected in series. In FIG. 2, four such charge transfer transistors are shown, labeled m1, m2, m3 and m4. The charge transfer transistors may use, but are not limited to, CMOS technology, being either n-channel or p-channel (NMOS or PMOS) field effect transistors (FETs). NMOS is generally used to pump positive voltages (this is the case illustrated in FIG. 2), whereas PMOS is generally used to pump negative voltages. The MOSFETs have a control electrode (e.g., gate), a first electrode (e.g., drain) and a second electrode (e.g., source), connected to nodes, as described hereinbelow. (Since MOSFETs are typically symmetrical components, the true designation of "source" and "drain" is only possible once a voltage is impressed on the terminals of the transistors. The designations of source and drain throughout the specification should be interpreted, therefore, in the broadest sense.) Preferably, the bulks of the charge transfer transistors mi are coupled to a reference line (not shown for the sake of simplicity) for receiving a reference voltage, generally ground in the case of NMOS.

The source of charge transfer transistor m1 is connected to node n0, which is connected to Vdd. The gate of charge transfer transistor m1 is connected to node g1, and the drain is connected to node n1. The source of charge transfer transistor m2 is connected to node n1, the gate is connected to node g2, and the drain is connected to node n2. The source of charge transfer transistor m3 is connected to node n2, the gate to node g3, and the drain to node n3. Likewise, the source of charge transfer transistor m4 is connected to node n3, the gate to node g4, and the drain to node n4.

Two-phase, non-overlapping pulse trains PH1 and PH2 are provided, such as from a pulse generator (not shown). By non-overlapping it is meant that 0-to-1 and 1-to-0 voltage transitions of one pulse never overlap with the transitions of the other pulse. The PH1 and PH2 phases inject energy into the pump through large capacitors C1, C2, C3 and C4 into nodes n1, n2, n3 and n4, respectively. The charge is transferred along the pump through charge transfer transistors m(i) connecting node n(i) to node n(i+1).

Similarly, two-phase, non-overlapping pulse trains PH1A and PH2A are also provided. The PH1A and PH2A phases inject energy into the pump through small capacitors C1A, C2A, C3A and C4A into nodes g1, g2, g3 and g4, respectively. Capacitors C1A, C2A, C3A and C4A preferably have a much smaller capacitance than large capacitors C1, C2, C3 and C4.

A plurality of auxiliary transistors ti (i.e., t1, t2, t3 and t4) may be provided. Each auxiliary transistor t(i) has its drain connected to the gate node g(i) of each charge transfer transistor m(i) (i.e., m1, m2, m3 and m4, respectively). The source of each auxiliary transistor t(i) is connected to the source of each charge transfer transistor m(i) (i.e., node n(i−1)). The gate of each auxiliary transistor t(i) is connected to the drain of each charge transfer transistor m(i) (i.e., node n(i)). The bulk of each auxiliary transistor t(i) is connected to the bulk of each charge transfer transistor m(i), which is generally grounded. The auxiliary transistors t(i) and the PH1A and PH2A phases control the gate voltage of the charge transfer transistors m(i).

The operation of the first stage of the pump is now explained, with all subsequent stages operating in the same manner. The operation commences with the PH1 phase starting to rise. Initially, charge transfer transistors m1 and m2 are non-conducting (i.e., turned off), since the PH1A and PH2A phases are in their low phase. The PH1 phase then fully rises and injects energy into node n1, raising (or "pushing") node n1 to a voltage boosted above Vdd, such as 2Vdd. The rise of node n1 forces node g1 to Vdd through auxiliary transistor t1. Since the source of charge transfer transistor m1 is connected to Vdd at node n0, the gate-source voltage bias Vgs of charge transfer transistor m1 is zero, assuring that transistor m1 is turned off.

After a short time, typically in the order of several nanoseconds, the PH1A phase rises, which makes charge transfer transistor m2 conduct (i.e., turns on). During this time, node n1 is at a higher voltage than node n2. Since, as just mentioned, charge transfer transistor m2 is conducting, charge is transferred from node n1 to node n2. During the next phase, the PH2 phase rises and the PH1 phase drops. This causes node n1 to drop and node n2 to rise, thereby causing charge to be transferred from node n2 to node n3. In this manner charge is transferred along the pump. Each of the g(i) nodes is raised by Vdd with respect to the n(i) nodes when charge transfer is taking place. In the latter stages of the pump, the source and drain nodes (i.e., nodes n3 and n4) are raised well above the bulk, which is usually grounded.

Accordingly, in the charge pump, energy is injected through the large capacitors C1-C4 by the oscillation of the clock signals PH1 and PH2. Referring again to FIG. 1, the cathode of the MOS capacitor 10 may be connected to one of the clocks, while the anode may be connected to the pump's interior nodes n1-n4. The oscillation of the cathode leaks current to GND through the parasitic capacitor 20. As the pump capacitors C1-C4 are very large, the parasitic currents associated with the parasitic capacitors may be a significant portion of the pump's power consumption and may range from 20-50% of the total power.

SUMMARY OF THE INVENTION

The present invention seeks to provide circuitry (apparatus and methods) for reducing the effects of the MOS parasitic capacitance in analog circuits, as is described more in detail hereinbelow.

There is thus provided in accordance with an embodiment of the present invention a capacitor including a first active layer capacitively coupled to a second active layer, the second active layer being capacitively coupled to a third layer, the third layer being capacitively coupled to a fourth layer, wherein an anode of the capacitor is connected to one of the first and second active layers, and a cathode of the capacitor is connected to the other one of the first and second active layers, and wherein the third layer is left floating. The fourth layer may be connected to a supply voltage, such as but not limited to, ground.

In accordance with an embodiment of the present invention the capacitor may be an inversion or an accumulation capacitor.

Further in accordance with an embodiment of the present invention, the first active layer may be a gate, the second active layer may be a P-well, the third layer may be an N-well and the fourth layer may be a P-substrate. For example, in the case of an inversion capacitor, two n+ diffusion regions may be formed in the P-well and connected to the cathode of the capacitor, wherein a p+ diffusion region is formed in the P-well and connected to a bulk of the capacitor, wherein an n+ diffusion region is formed in the N-well, the anode being connected to the gate and being capacitively coupled to the cathode through the gate, and wherein the P-well is capacitively coupled to the N-well by a first parasitic diode capacitor and the N-well is capacitively coupled to the P-substrate by a second parasitic diode capacitor.

In the case of an accumulation capacitor, for example, two p+ diffusion regions may be formed in the P-well and connected to the anode of the capacitor, wherein an n+ diffusion region is formed in the N-well, the cathode being connected to the gate and being capacitively coupled to the anode through the gate, and wherein the P-well is capacitively coupled to the N-well by a first parasitic diode capacitor and the N-well is capacitively coupled to the P-substrate by a second parasitic diode capacitor.

In accordance with an embodiment of the present invention the capacitor may be connected to a charge pump stage. For example, the anode of the capacitor may be connected to a drain of a charge transfer transistor of the charge pump stage, the cathode of the capacitor may be connected to a clock signal of the charge pump stage, and the third layer which is left floating may be connected to a voltage (e.g., a refresh voltage) or to a pump output of the charge pump stage, e.g., via a switch.

Further in accordance with an embodiment of the present invention the capacitor may be connected to an electronic circuit, e.g., an input stage of an operational amplifier.

BRIEF DESCRIPTION OF THE DRAWINGS

The present invention will be understood and appreciated more fully from the following detailed description taken in conjunction with the drawings in which:

FIGS. 2 and 3 are simplified circuit diagrams of a charge pump architecture commonly used in the prior art, comprising a threshold-voltage-canceling four-phased Dickson-type charge pump, wherein FIG. 2 illustrates four stages of the charge pump and FIG. 3 illustrates a single, general stage of the charge pump;

DETAILED DESCRIPTION OF EMBODIMENTS

Figure 4A:
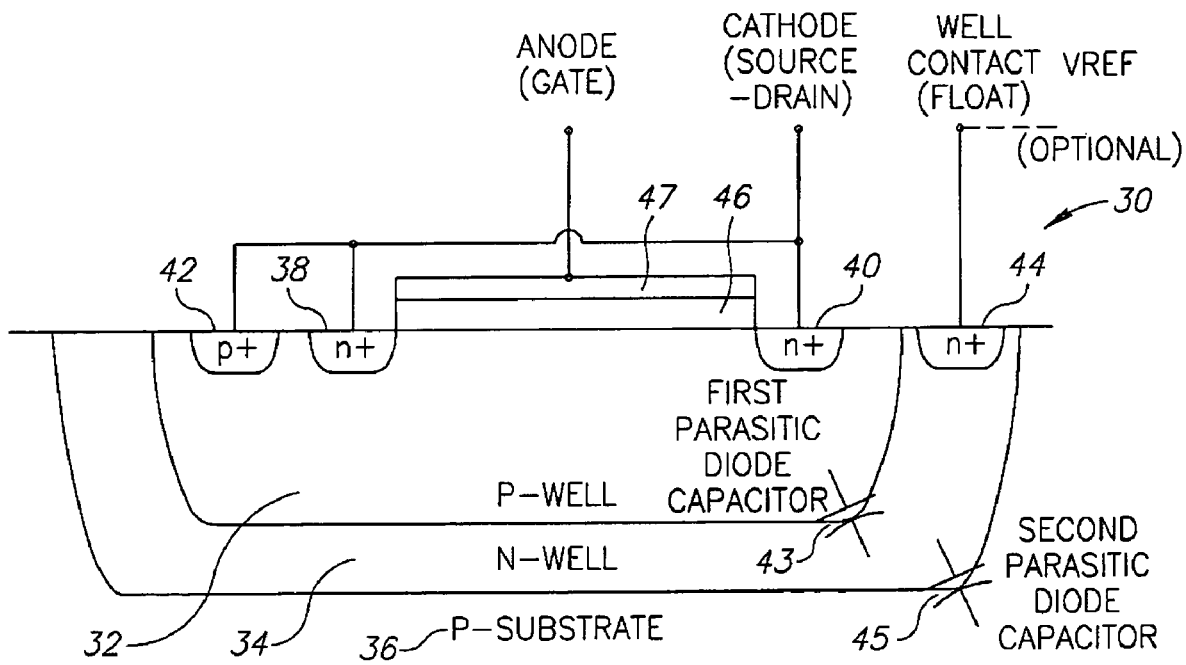
FIG. 4A is a simplified circuit diagram of a MOS capacitor with low parasitic capacitance, constructed and operative in accordance with an embodiment of the invention, configured as an inversion capacitor.

Reference is now made to FIG. 4A, which illustrates a MOS capacitor 30 with low parasitic capacitance, constructed and operative in accordance with an embodiment of the invention.

In this embodiment, MOS capacitor 30 comprises a triple-well NMOS device, and is an example of an inversion capacitor. The triple-well NMOS device includes a P-well 32 isolated from a P-substrate 36 by an N-well 34. Two n+ diffusion regions 38 and 40 may be formed in the P-well 32 for connecting to the cathode of MOS capacitor 30 (source and drain). A p+ diffusion region 42 may be formed in the P-well 32 for connecting to the bulk (e.g., connected to the source). An n+ diffusion region 44 may be formed in the N-well 34, which may be connected to a floating voltage, designated as the well contact (which may be, but not necessarily, equal to or higher than p+). A gate oxide 46 (also referred to as gate 46) may be fabricated on top of P-well 32. A conductive layer 47 may be disposed on gate oxide 46. The P-substrate 36 may be connected to a supply voltage (Vsupply), which may be ground, for example.

It is noted that n+ diffusion regions 38 and 40 (source and drain) and p+ diffusion region 42 are all shorted to the cathode, while the gate is the anode. The anode is capacitively coupled to the cathode through the gate oxide 46. The P-well 32 is capacitively coupled to the N-well 34 by a first parasitic diode capacitor 43. Likewise, the N-well 34 is capacitively coupled to the P-substrate 36 by a second parasitic diode capacitor 45. The anode and cathode are the active layers of the MOS capacitor 30.

Figure 5:
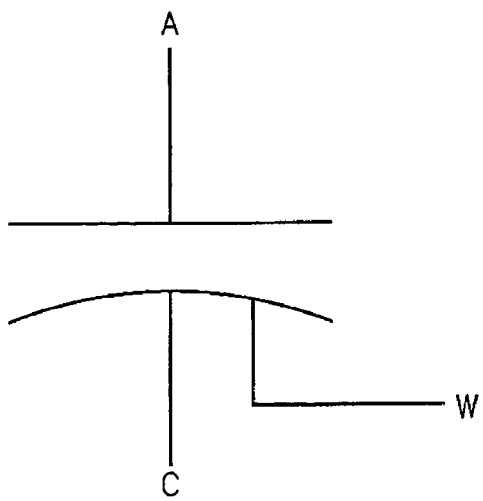
FIG. 5 is a simplified symbolic representation of the MOS capacitor of FIG. 4A.

FIG. 5 illustrates a symbolic representation of the MOS transistor 30. The connections are A for the anode, C for the cathode and W for the floating N-well 34.

The triple-well NMOS device shown in FIG. 4A may be implemented in most analog CMOS processes and EPROM (erasable, programmable read only memory) processes where charge pumps are used, such that there is no added process cost, as is known by those skilled in the art.

As noted above, the N-well 34 may be left floating, which causes the parasitic capacitors 43 and 45 to be effectively connected in series. Connecting two capacitances, Ci and Cj, in series causes the equivalent capacitance, Ceq to be $1/C_{eq}=1/C_i+1/C_j$ For example, if the capacitances of parasitic capacitors 43 and 45 are equal, the equivalent capacitance is one-half the capacitance of either parasitic capacitor 43 or 45. Thus, by this connection, one can reduce the parasitic well capacitance by a factor of two. In addition, since the capacitance of either parasitic capacitor 43 or 45 is inversely proportional to its space-charge layer thickness, it is preferable to raise the N-well 34 to the highest possible voltage, and then leave it floating at that voltage, in order to maximize the space-charge layer. This will cause both parasitic diode capacitors 43 and 45 to have minimum capacitance. During operation, the N-well 34 may be periodically refreshed so that it does not drift. This may be done by connecting it to a refresh voltage, such as but not limited to, an available voltage Vref for a short time (20 ns), preferably during a cycle where the circuit using the capacitor is not active.

Figure 4B:
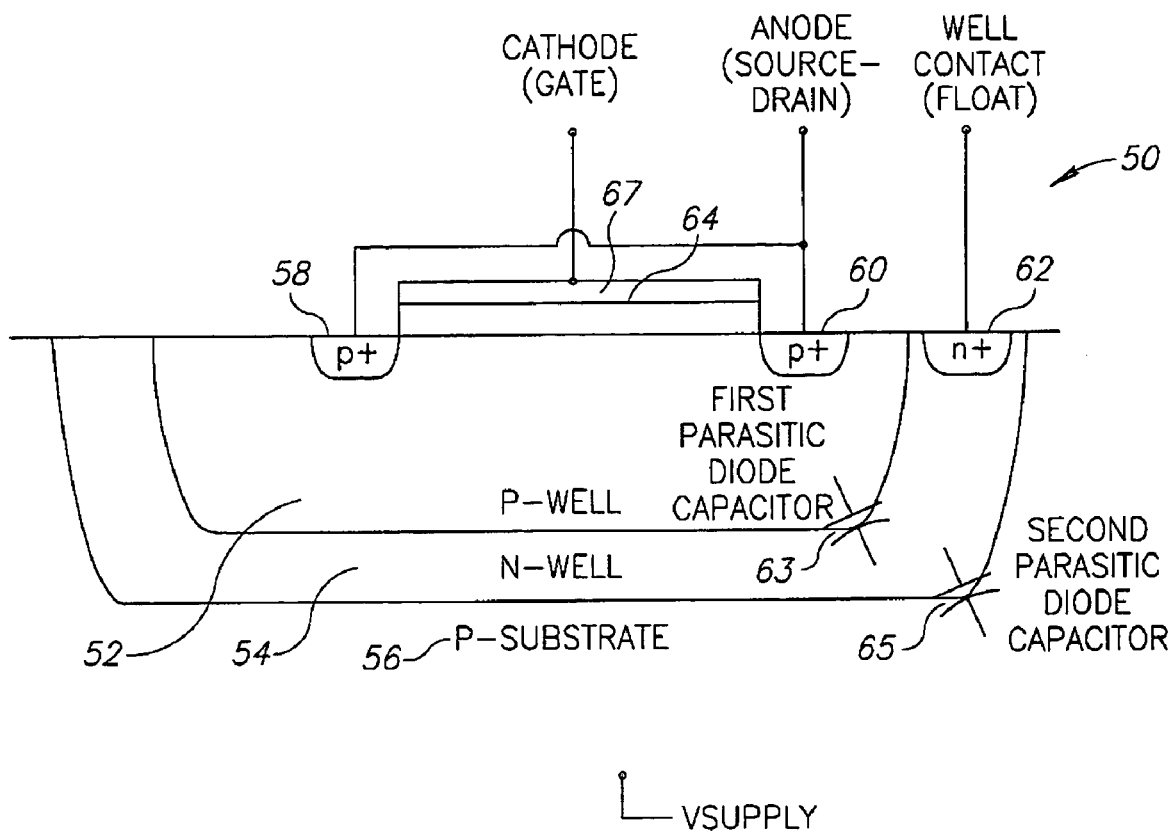
FIG. 4B is a simplified circuit diagram of a MOS capacitor with low parasitic capacitance, constructed and operative in accordance with another embodiment of the invention, configured as an accumulation capacitor.

Reference is now made to FIG. 4B, which illustrates a MOS capacitor 50 with low parasitic capacitance, constructed and operative in accordance with another embodiment of the invention.

In this embodiment, MOS capacitor 50 is triple-well MOS capacitor (not NMOS), and is an example of an accumulation capacitor. The triple-well MOS capacitor includes a P-well 52 isolated from a P-substrate 56 by an N-well 54. The P-substrate 56 may be connected to a supply voltage (Vsupply), which may be ground, for example. Two p+ diffusion regions 58 and 60 may be formed in the P-well 52 for connecting to the anode of MOS capacitor 50 (source and drain). An n+ diffusion region 62 may be formed in the N-well 54, which may be connected to a floating voltage (well contact as in FIG. 4A). A gate oxide 64 (also referred to as gate 64) may be fabricated on top of P-well 52. A conductive layer 67 may be disposed on gate oxide 64. The P-well 52 is capacitively coupled to the N-well 54 by a first parasitic diode capacitor 63. Likewise, the N-well 54 is capacitively coupled to the P-substrate 56 by a second parasitic diode capacitor 65.

In this embodiment, the cathode of MOS capacitor 50 is at the gate, and p+ diffusion regions 58 and 60 are connected to the anode. The anode parasitic capacitance may be reduced by leaving the N-well 54 floating in a manner similar to MOS transistor 30, as described hereinabove.

Figure 6:
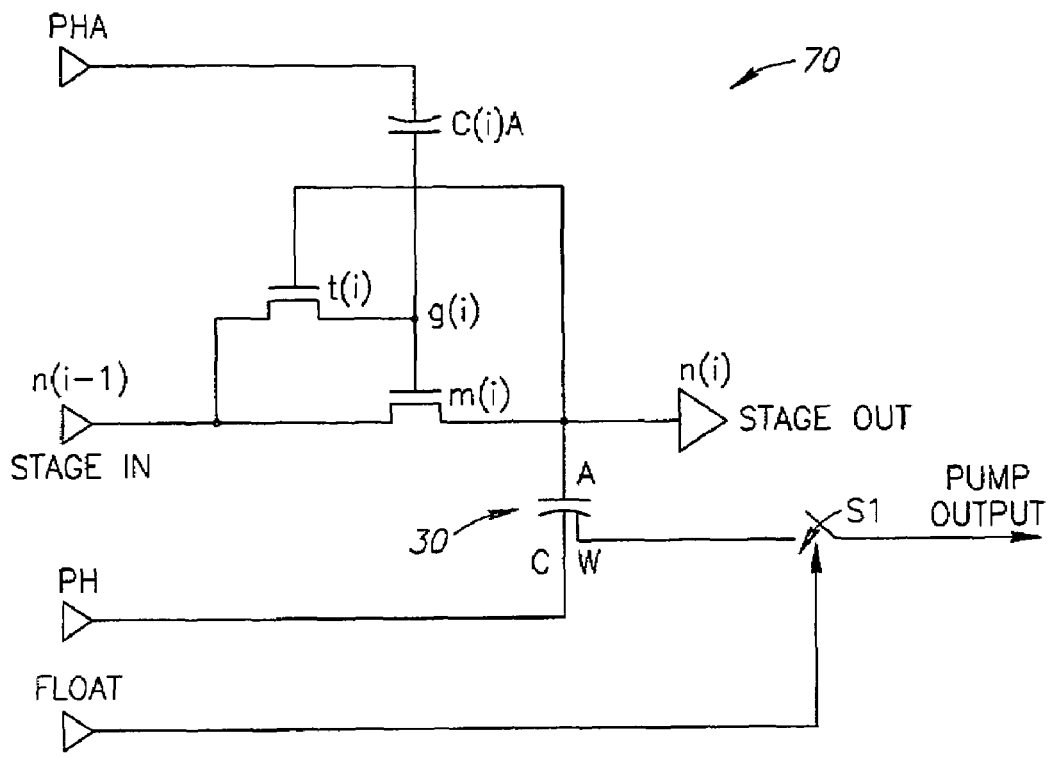
FIG. 6 is a simplified circuit diagram of a single, general stage of a charge pump using the MOS capacitor of FIG. 4A or 4B, constructed and operative in accordance with an embodiment of the invention.

Reference is now made to FIG. 6, which illustrates a single, general charge pump stage 70 using the MOS capacitor 30 or 50 of FIG. 4A or 4B, respectively, constructed and operative in accordance with an embodiment of the invention.

The charge pump stage 70 may operate (but not necessarily) in a manner similar to that of U.S. patent application 2002/0145464, described hereinabove, except that MOS capacitor 30 or 50 of FIG. 4A or 4B, respectively, has been added. The anode (A node) of the capacitor 30 or 50 may be connected to node n(i) of the charge pump stage 70, meaning that the anode is connected to the drain of NMOS charge transfer transistor m(i). The cathode (C node) of the capacitor 30 or 50 may be connected to the pulse train (i.e., clock signal) PH of the charge pump stage 70. The W node of the capacitor 30 or 50 (that is, the node connected to the floating N-well 34 or 54, respectively) may be connected to the pump output of the charge pump stage 70 via a switch S1.

The switch S1 may be made conducting initially in order to charge the N-well 34 or 54 to the pump output. After this charging is complete, the switch S1 may be made non-conducting, allowing the N-well 34 or 54 to float. The switch S1 may be made conducting periodically for short times in order to refresh the N-well 34 or 54. For example, the switch S1 may be made conducting for 100 ns every 5 μs. This means that for 4.9 μs out of 5 μs (98% of the time), the circuit will be in a current savings mode.

Figure 7:
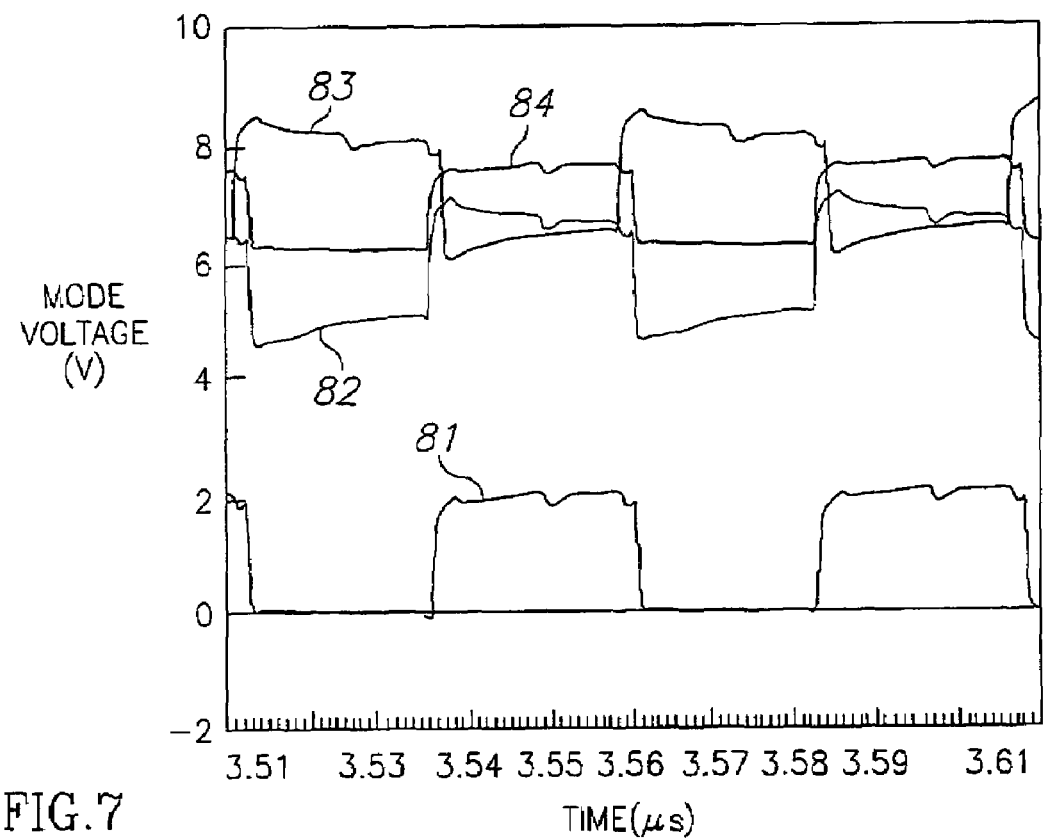
FIG. 7 is a simplified graph of a simulation of the charge pump stage of FIG. 6, wherein the abscissa is time in μs and the ordinate is the voltage of the node in V.

Reference is now made to FIG. 7, which illustrates simulated waveforms of the charge pump stage 70 during operation. The waveforms for nodes PH, stage in (node n(i−1)), stage out (node n(i)), and W (the node connected to the floating N-well 34 or 54, respectively) are respectively designated by reference numerals 81, 82, 83 and 84.

Figure 1:
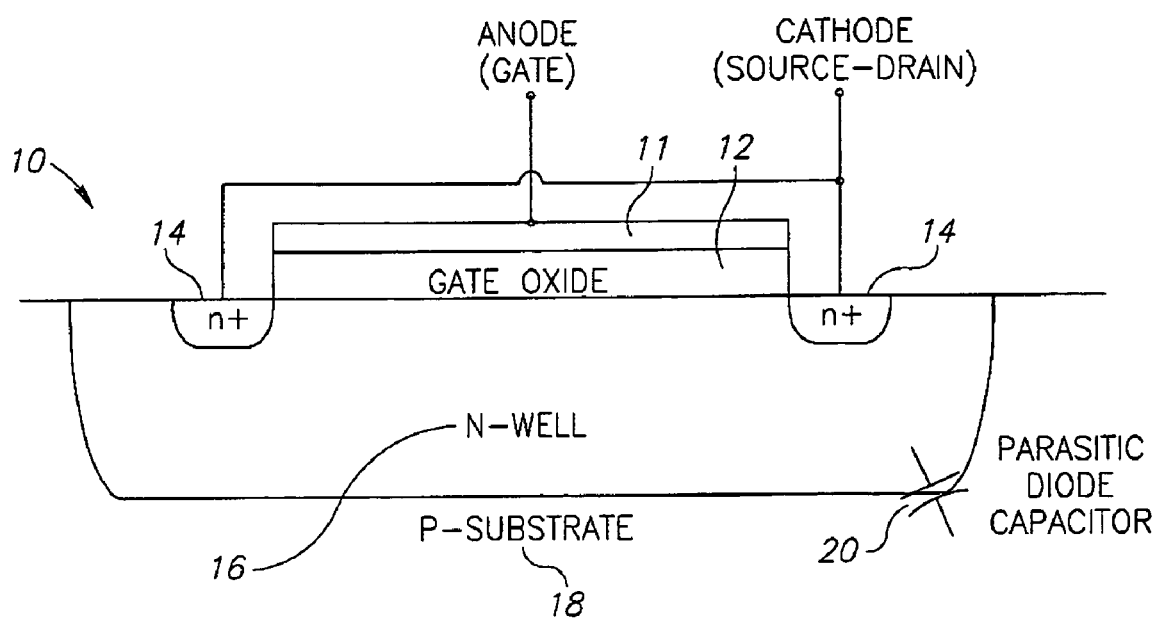
FIG. 1 is a simplified circuit diagram of a typical MOS capacitor of the prior art, having a parasitic diode capacitor.
Figure 2:
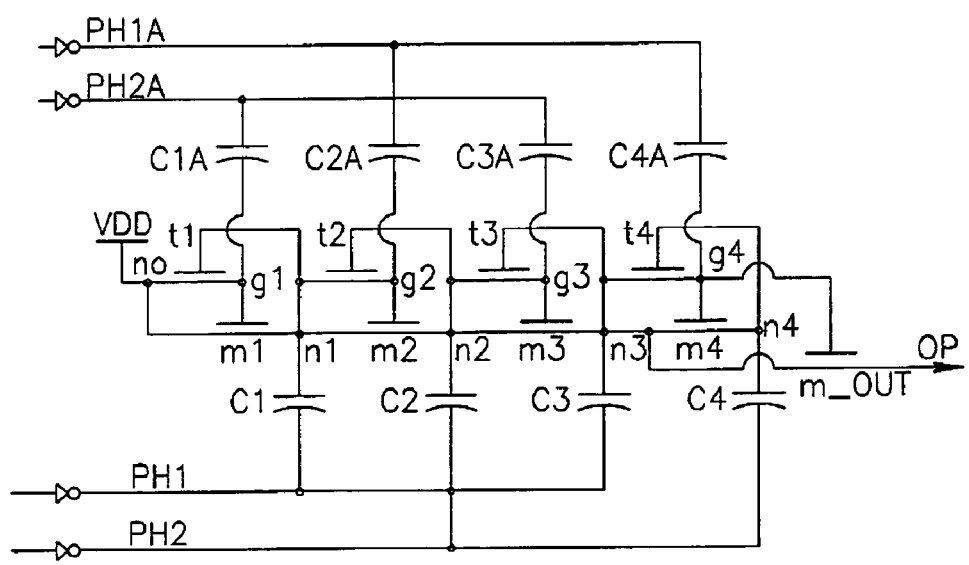
Figure 2:
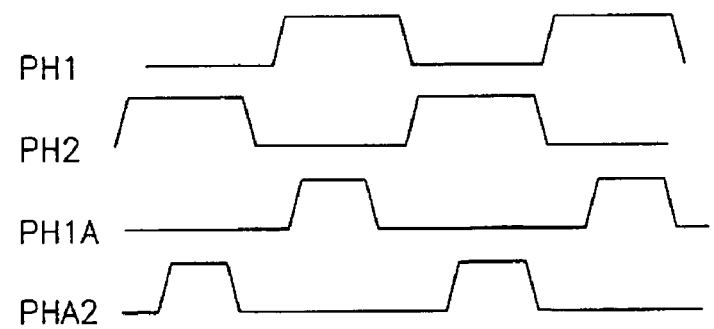
Figure 3:
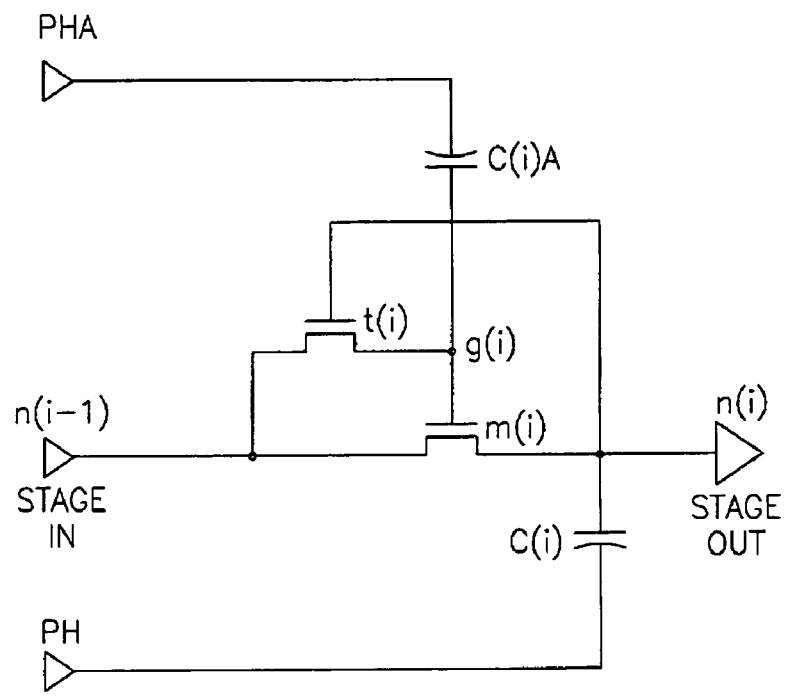

In a prior art pump stage, such as FIG. 3, the oscillations of PH would be across the parasitic N-well capacitor to GND, thus causing power loss. In the present invention the magnitude of oscillation in the W node (about 1 volt) is roughly half that of PH (about 2 volts) (which may be seen in FIG. 7 by comparing waveforms 84 and 81, respectively), due to the capacitive divider between the two parasitic capacitors. Thus, the power loss is halved as well.

Figure 8:
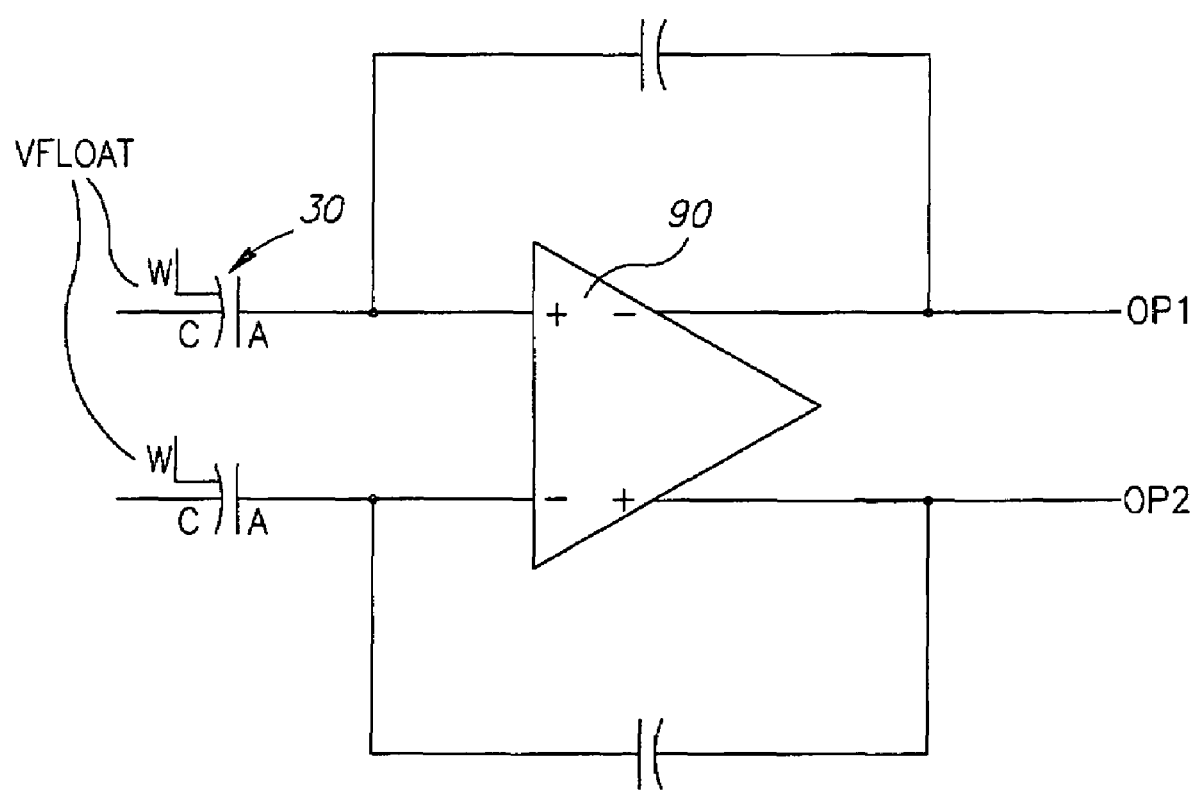
FIG. 8 is a simplified circuit diagram of an input stage of a fully differential operational amplifier using the MOS capacitor of FIG. 4A or 4B, constructed and operative in accordance with an embodiment of the invention.

Reference is now made to FIG. 8, which illustrates an input stage of a fully differential operational amplifier (op-amp) using the MOS capacitor 30 (inversion capacitor) of FIG. 4A, constructed and operative in accordance with an embodiment of the invention. It is appreciated that the MOS capacitor 50 (accumulation capacitor) of FIG. 4B could also be used in an op-amp as well. It is further appreciated that this is just one example of an electronic circuit to which the capacitor may be connected, and the capacitor may be connected to other examples of electronic circuits within the scope of the invention.

In the illustrated embodiment, a pair of the MOS capacitors 30 may be used as the input capacitors to a fully differential amplifier 90. The input signals, IP1 and IP2, which are relatively weak, must be amplified. By floating the W node at a voltage Vfloat, the input impedance is reduced. In some applications, one of the two inputs may be a reference signal and may be connected to many such amplifiers in parallel; thus the input impedance may be a critical parameter. Such an application may be a sense amplifier in an EPROM chip, for which the reference current is compared to the cell currents. In many cases there may be a single reference for a group of sense amplifiers that may drive a large number of these capacitors, which would make a reduction in the parasitic capacitance very significant.

It will be appreciated by person skilled in the art, that the present invention is not limited by what has been particularly shown and described herein above. Rather the scope of the present invention is defined only by the claims that follow:

What is claimed is:

1. A charge pump capacitor comprising: a first active layer capacitively coupled to a second active layer, said second active layer being capacitively coupled to a third layer, said third layer being capacitively coupled to a fourth layer, wherein an anode of the capacitor is connected to one of said first and second active layers, and a cathode of the capacitor is connected to the other one of said first and second active layers, and wherein the capacitor is connected to a charge pump stage, the anode of the capacitor is connected to a drain of a charge transfer transistor of said charge pump stage, the cathode of the capacitor is connected to a clock signal of said charge pump stage, and said third layer is connected to a voltage.

2. The capacitor according to claim 1, wherein said third layer is connected to a refresh voltage.

3. The capacitor according to claim 1, wherein said third layer is connected to a pump output of said charge pump stage.

* * * * *